United States Patent
Pascucci, IV

(10) Patent No.: US 11,296,665 B2
(45) Date of Patent: Apr. 5, 2022

(54) AMPLIFIER ARRANGEMENT

(71) Applicant: Sennheiser electronic GmbH & Co. KG, Wedemark (DE)

(72) Inventor: Vittorio Pascucci, IV, Am Stolwijk (NL)

(73) Assignee: Sennheiser electronic GmbH & Co. KG, Wedemark (DE)

( * ) Notice: Subject to any disclaimer, the term of this patent is extended or adjusted under 35 U.S.C. 154(b) by 0 days.

(21) Appl. No.: 17/096,125

(22) Filed: Nov. 12, 2020

(65) Prior Publication Data

US 2021/0152141 A1    May 20, 2021

(30) Foreign Application Priority Data

Nov. 14, 2019   (DE) .......................... 102019130691.4

(51) Int. Cl.
   *H03F 3/45* (2006.01)
   *H03F 1/26* (2006.01)
   (Continued)

(52) U.S. Cl.
   CPC .......... *H03F 3/45475* (2013.01); *H03F 1/26* (2013.01); *H03G 3/3005* (2013.01); *H04B 1/04* (2013.01);
   (Continued)

(58) Field of Classification Search
   CPC ............ H03F 3/45475; H03F 2200/03; H03G 3/3005; H04B 1/04; H04R 1/08; H04R 2420/07
   See application file for complete search history.

(56) References Cited

U.S. PATENT DOCUMENTS

| 6,577,187 | B1 * | 6/2003 | Lesko ...................... H03F 1/30 327/307 |
| 2009/0002075 | A1 * | 1/2009 | Chilakapati ............... H03F 3/20 330/297 |

(Continued)

FOREIGN PATENT DOCUMENTS

WO    WO 2017/065965    4/2017

OTHER PUBLICATIONS

German Search Report for Application No. DE 10 2019 130 164.4 dated Jul. 30, 2020.

*Primary Examiner* — David L Ton
(74) *Attorney, Agent, or Firm* — Haug Partners LLP

(57) ABSTRACT

For converting analog audio signals captured by a microphone into digital audio data, the analog audio signals are first amplified in a pre-amplifier and then fed to an analog-to-digital converter (ADC). For better utilizing the dynamic range of the ADC, a DC coupled dual amplifier circuit may be used herein that automatically switches between two amplifier branches with different gain factors. To avoid switching noise, both signals must have the same DC component before the analog-to-digital conversion. To achieve this, the amplifier arrangement comprises a first amplifier branch having a higher first gain factor ($G_1$) and providing a first output voltage ($V_{OUT1}$) and a second amplifier branch having a lower second gain factor ($G_2$) and providing a second output voltage ($V_{OUT2}$). Both amplifier branches are DC coupled and receive as a common input signal an audio signal with a predetermined DC component ($V_k$). The amplifier arrangement further comprises a differentiating member (D) for generating a voltage difference between the two output voltages ($V_{OUT1}$, $V_{OUT2}$). From the voltage difference, a control voltage ($V_{bias}$) is generated for controlling the DC component ($V_k$) of the input signal such (Continued)

that the DC components of the output voltages ($V_{OUT1}$, $V_{OUT2}$) are aligned to each other.

14 Claims, 3 Drawing Sheets

(51) Int. Cl.
  *H03G 3/30* (2006.01)
  *H04R 1/08* (2006.01)
  *H04B 1/04* (2006.01)
(52) U.S. Cl.
  CPC ............ *H04R 1/08* (2013.01); *H03F 2200/03* (2013.01); *H04R 2420/07* (2013.01)

(56) References Cited

U.S. PATENT DOCUMENTS

| | | | |
|---|---|---|---|
| 2011/0026739 A1* | 2/2011 | Thomsen | H03F 3/68 |
| | | | 381/120 |
| 2011/0029109 A1* | 2/2011 | Thomsen | H03F 3/45475 |
| | | | 700/94 |
| 2013/0129117 A1* | 5/2013 | Thomsen | H04R 3/00 |
| | | | 381/111 |
| 2017/0012589 A1* | 1/2017 | Wang | H04R 3/10 |
| 2017/0111012 A1* | 4/2017 | Jennings | H03F 1/30 |

* cited by examiner $V_{OUT1} = (V_{DCC} + V_{DC1i}) G_1 + V_{DC1o}$ $V_{OUT2} = (V_{DCC} + V_{DC2i}) G_2 + V_{DC2o}$ $G_1 \gg G_2$

AMPLIFIER ARRANGEMENT

CROSS-REFERENCE TO RELATED APPLICATIONS

This application claims the benefit of the foreign priority of German Patent Application No. 10 2019 130 691.4, filed on Nov. 14, 2019, the entirety of which is incorporated herein by reference.

FIELD OF DISCLOSURE

The invention relates to an amplifier arrangement, in particular to a device for amplifying analog audio signals.

BACKGROUND

For converting analog audio signals captured by a microphone into digital audio data, the analog audio signals are first amplified in a pre-amplifier and then fed to an analog-to-digital converter (ADC). The pre-amplifier and the ADC as well as further components, e.g. a transmitter and batteries or accumulators for power supply, can be included in a wireless microphone. The dynamic range to be captured by the microphone is often so large (e.g. more than 120 decibels) that it is necessary to switch or regulate the gain factor of the pre-amplifier, depending on the input signal level. However, manual switching or regulating is inconvenient for the user, and furthermore harbors the risk of an incorrect operating. A dual pre-amplifier circuit is known that automatically switches between two amplifier branches with different gain factors. This allows the dynamic range of the ADC to be used better, so that the resolution of the digital signal is improved at low volume. A block diagram is shown in FIG. 1.

An analog audio signal at an input IN coming e.g. from a microphone capsule is fed to both, a first amplifier branch comprising a first amplifier with high gain $G_1$ and a second amplifier branch comprising a second amplifier with lower gain $G_2$. The two amplified signals $OUT_1$, $OUT_2$ are digitized in an ADC and filtered with separate, but equal digital high-pass filters $HP_1, HP_2$ for removing the DC component. The ADC is e.g. a stereo ADC that samples both channels simultaneously. Then, the higher gain of the first amplifier branch is digitally compensated by multiplying the values with $G_2/G_1$. Now it is possible to switch by means of a switch SEL between the two signals for selecting an output signal to be provided at the output OUT, depending on the volume level of the input signal. At a low volume level of the input signal, the digital output signal of the first branch is selected, because it has a better resolution and higher signal-to-noise ratio. At a larger volume level of the input signal however, the first amplifier branch may enter a saturation range where the amplification becomes non-linear, which generates interferences. Therefore, the switch SEL is used to switch to the digital output signal of the second amplifier branch in this case.

There are coupling capacitors $C_{G1i}, C_{G1o}, C_{G2i}, C_{G2o}$ between the single stages of the analog processing. Usually, the capacitors' values are subject to relatively large tolerances. Since these values have an influence on the phase of the signals, there are often differences in the phases of the signals of the two branches while switching, particularly at low frequencies. This leads to signal interference while switching, such as e.g. clicking noise.

This problem may be solved by DC coupling the amplifiers, as shown in FIG. 2. An AC voltage in the input signal fed to the input IN is decoupled by a capacitor $C_{in}$ and fed to both the two amplifier branches. Each amplifier branch, including the associated ADC, is DC coupled, so that there are no capacitors in the signal path. This avoids phase differences between the amplifier branches. After digitization, potentially occurring DC residual components in the signal can be removed by two exactly equal digital filters $HP_1, HP_2$, wherein the phase relationship between the channels, or amplifier branches respectively, is not changed. However, the problem arises here that even the smallest DC voltage deviation along the analog processing chain, especially in the branch with the greater gain, generates significant deviations at the switchover point, which leads to interference when switching over. This ultimately limits the usable dynamic range of the amplifier.

An object of the present invention is to solve this problem. It is noted that the above description is not an admission of prior art for the present invention, unless expressly stated.

SUMMARY

The object is solved by an amplifier arrangement according to claim 1.

According to the invention, an amplifier arrangement comprises an input for connecting an analog input audio signal, which is then converted into an audio signal with a predetermined DC voltage component. The amplifier arrangement also comprises a first amplifier branch that has a first gain and provides a first output voltage, a second amplifier branch that has a second gain and provides a second output voltage, wherein the second gain is lower than the first gain, and a differentiating element or differentiator generating a voltage difference between the first and second output voltages. From this voltage difference, a control voltage for controlling the DC voltage component of the input signal is obtained in order to thereby minimize a DC component of the voltage difference between the output voltages. That is, the control voltage determines the predetermined DC voltage component of the input signal. At the same time, the DC components of the output voltages may be set to a desired value, as is required, for example, for certain ADCs. Both the first and second amplifier branches receive the same audio signal with the predetermined DC voltage component as input signal, and both are DC coupled.

Since, due to the regulation according to the invention, both output voltages always have the same DC voltage component, it is possible to switch without interference between the channels after the subsequent analog-to-digital conversion.

Further advantageous embodiments are disclosed in the dependent claims.

BRIEF DESCRIPTION OF THE DRAWINGS

Further details and advantageous embodiments are depicted in the drawings, showing in FIG. 1 illustrates a block circuit diagram of a known AC coupled dual amplifier circuit.

DETAILED DESCRIPTION

The invention can be used in a variety of different devices, e.g. wireless microphones, wireless headsets or pocket transmitters for headsets, so-called body packs.

Figure 1:
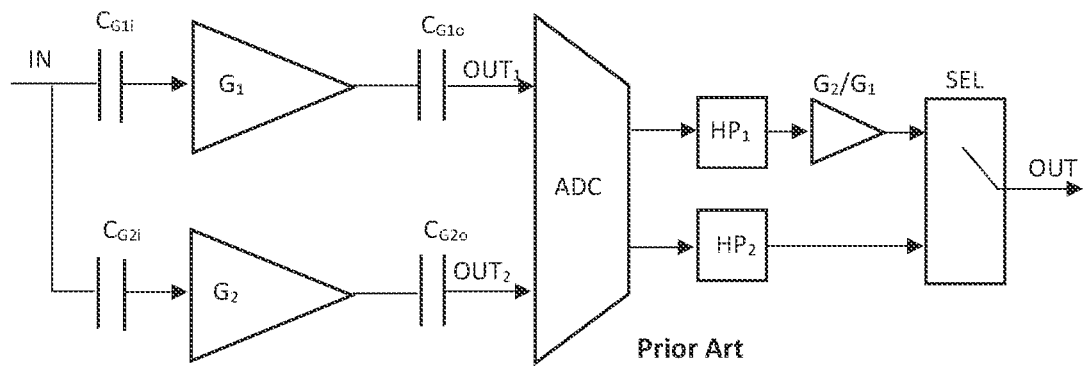
Figure 2:
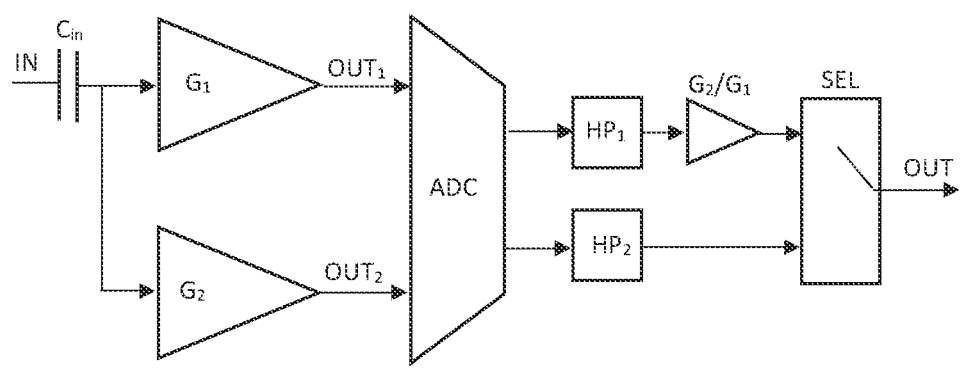
FIG. 2 illustrates a block circuit diagram of a DC coupled dual amplifier circuit.
Figure 3:
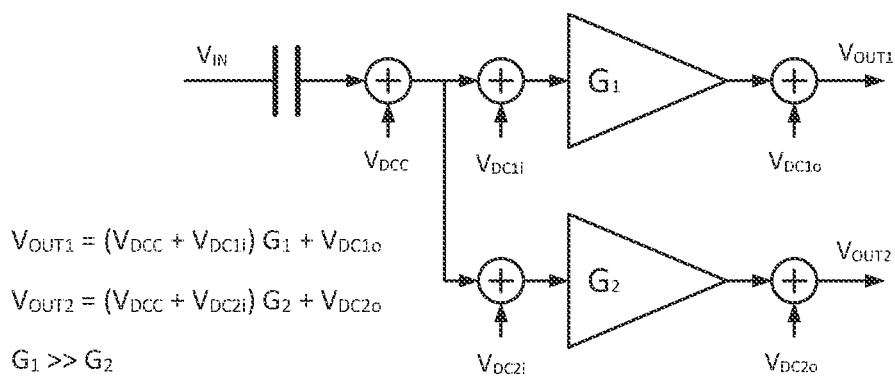
FIG. 3 illustrates a DC equivalent circuit diagram of the DC coupled dual amplifier circuit.

FIG. 3 shows a DC equivalent circuit diagram of the DC coupled dual amplifier circuit of FIG. 2. $V_{DCC}$ is a DC voltage that is common to both channels and corresponds to e.g. a total voltage drop that is caused by the bias current of the two amplifiers on the resulting input impedance, which is formed by connecting the input impedances of the two amplifier branches in parallel. $V_{DC1i}$ and $V_{DC2i}$ are voltages that occur in the amplifiers before the actual amplification (i.e. source of gain), and they are uncorrelated and specific for each of the two branches, and thus may differ from each other. They can be caused e.g. by a voltage drop between base and emitter of a bipolar junction transistor (BJT), the cutoff voltage of a junction gate field-effect transistor (JFET) or the threshold voltage of a MOSFET, with their respective tolerances.

$V_{DC1o}$ and $V_{DC2o}$ occur in the amplifier branch after the actual amplification, e.g. due to component tolerances or non-idealities, and they are also uncorrelated and specific for each of the branches. However, often they are only marginal. The DC component of the input voltage $V_{DCC}$ influences the bias voltage of both amplifier branches. It may already cause an amplifier that has a high gain to be clipping, since the actual audio signal is superimposed as an AC voltage to the DC voltage components considered here. However, such clipping needs to be avoided. A further problem is that the DC voltage components $V_{OUT1}, V_{OUT2}$ of the two amplifier branches may vary independently from each other, which is a problem for the subsequent analog-to-digital conversion.

Therefore, an amplifier arrangement according to the invention comprises a comparator or differentiating member that detects differences between the DC voltage components of the output signals, as well as a DC voltage feedback that regulates the DC voltage component of the input voltage by using the detected difference. This ensures that the output signals of both amplifier branches have the same DC component.

Figure 4:
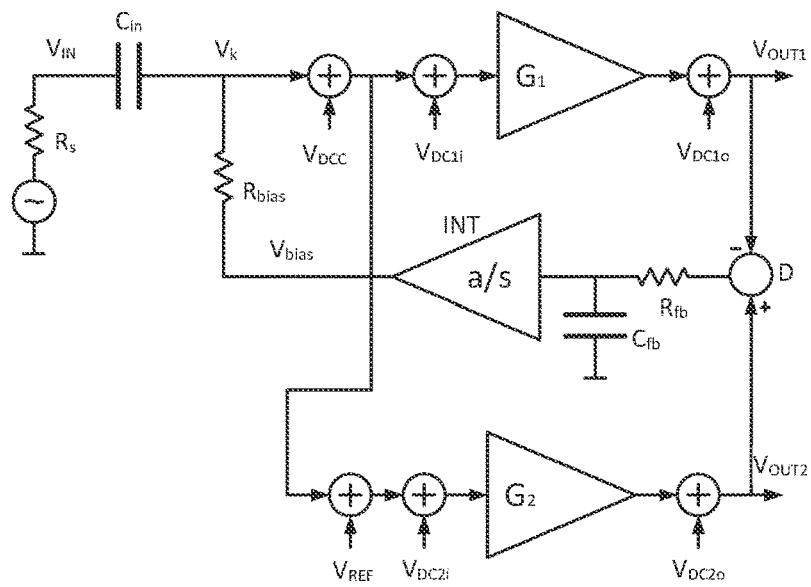
FIG. 4 illustrates a DC equivalent circuit diagram of a DC coupled dual amplifier circuit according to the invention.

FIG. 4 shows a DC equivalent circuit diagram of a DC coupled dual amplifier circuit, according to an embodiment of the invention. An analog input audio signal is connected to the amplifier via a capacitor $C_{in}$ and thereby impinged with a DC voltage $V_{DCC}$ as described above. The actual audio signal is superimposed as an AC voltage to the DC voltage components considered here. The audio source may have an internal resistance $R_S$ and may provide a DC voltage component $V_{IN}$, which however is filtered out by the capacitor $C_{IN}$. This signal initially impinged with a predetermined DC voltage component $V_{DCC}$ is fed to both the two parallel DC coupled amplifier branches. The first amplifier branch having a first gain factor $G_1$ provides a first output voltage $V_{OUT1}$ while the second amplifier branch having a significantly lower second gain factor $G_2$ provides a second output voltage $V_{OUT2}$. Additionally, a reference voltage $V_{REF}$ is fed to the second amplifier branch, the meaning of which will be explained below. A differentiating element D now detects a voltage difference between the two output voltages $V_{OUT1}$, $V_{OUT2}$. Since these voltages usually contain also AC components of the audio signal, their DC component is filtered out by a low-pass made from an RC element $R_{fb}, C_{fb}$. A cutoff frequency of about 20 Hz may be selected for the low-pass. Alternatively, the two output voltages $V_{OUT1}, V_{OUT2}$ may also be filtered via separate low-pass filters before the differentiating element D, so that only their DC components will be compared with each other.

The DC voltage component of the voltage difference is now integrated over time by an integrating member INT and then fed back via a feedback resistor $R_{bias}$ as a control voltage $V_{bias}$ to the common input of the two amplifier branches. Correspondingly, there is now a DC voltage $V_k$ at the common input that influences the operating points of both amplifier branches. This DC voltage $V_k$ is the above-mentioned predetermined DC component, as it is determined by the control voltage $V_{bias}$. The feedback of the control voltage $V_{bias}$ creates a closed control loop that can be considered as an active bias control. The integrating member INT may be designed e.g. with a gain factor a (or a/s in the frequency domain) such that the control loop is stable and has a cutoff frequency of 5 Hz or below, e.g. around 2 Hz.

Figure 5:
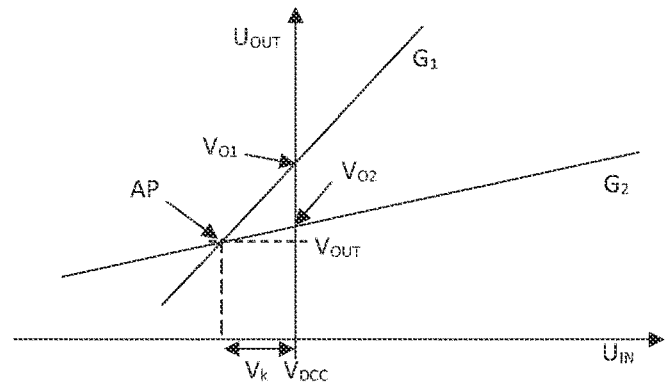
FIG. 5 illustrates a characteristic curve diagram of a DC coupled dual amplifier according to the invention.

FIG. 5 shows a corresponding diagram of characteristic curves which relate to both, the DC voltage component and the total voltage with superimposed AC components. Different curves with significantly different gain factors $G_1, G_2$ apply to the two amplifier branches. Due to the two branches' DC voltage components $V_{DC1i}, V_{DC1o}, V_{DC2i}, V_{DC2o}$, that are independent and therefore usually different from each other, and due to the DC component $V_{DCC}$ of the input voltage (which may initially be zero, for example), the amplifiers would initially (i.e. without feedback loop) work at different operating points. In that case, the output voltage of the first branch would include a DC component $V_{O1}$ while the output voltage of the second branch would include a different DC component of $V_{O2}$. However, it is preferable to set the operating points at the intersection AP of the two curves, since then both output voltages have the same DC component $V_{OUT}$. Therefore, according to the invention, the control voltage $V_{bias}$ regulates the DC voltage component of the input signal of both amplifier branches such that the DC component of the voltage difference (or the voltage difference of the DC components, respectively) at the output is minimized. In the steady state, $V_{bias} = V_k$ applies.

An advantage of the invention is that it may be used even if at least one of the two characteristic curves is non-linear. For this, the position of the two curves relative to each other may be modified by a control voltage that is added to the input signal of one of the two amplifier branches, such as the reference voltage $V_{REF}$ shown in FIG. 4. For example, in one embodiment the first amplifier branch may comprise a special discrete transistor as a particularly low-noise amplification element with a high gain $G_1$, which however has a non-linear characteristic curve. The second amplifier branch, on the other hand, may have an operational amplifier with a linear characteristic curve and a lower gain factor $G_2$. By using the control voltage $V_{REF}$ it is now possible to shift the linear curve relative to the non-linear curve. The control voltage $V_{REF}$ needs not be actively regulated; it needs only be adjusted once. Since the above-described control loop is superimposed to this shift and continues to place the operating point at the intersection AP of the two curves, it is possible to set the operating point of the amplifier arrangement, or the DC voltage component of the output voltages respectively, very precisely by means of the control voltage $V_{REF}$.

The above-described switching technology offers several advantages, e.g. as compared to "automatic gain control" (AGC): first, the usable dynamic range is increased, while an ADC with low bit depth may be used however, and wherein no control of the gain factor of the analog circuit is required that might lead to problems in transient states. E.g. an energy-saving and inexpensive 16-bit ADC can be used, which is particularly advantageous for usage in battery operated devices. Compared with a simple amplifier, the effective dynamic range is increased by the ratio $G_1/G_2$ of the two gain factors. Gain factors that differ significantly are particularly advantageous, for example 0 decibels (dB) for $G_2$ and 20 dB to 30 dB for $G_1$. The gain factors $G_1,G_2$ should differ at least by 10 dB (corresponding to a factor of ten). Second, both channels are sampled simultaneously and the switching is done in the digital domain. This means that most of the component-related deviations can be corrected or compensated for, so that most of the artifacts that would otherwise be hearable when switching between the channels are eliminated. Correspondingly, it is also possible to use inexpensive hardware components although they have high tolerances; these are compensated by the regulation.

Figure 6:
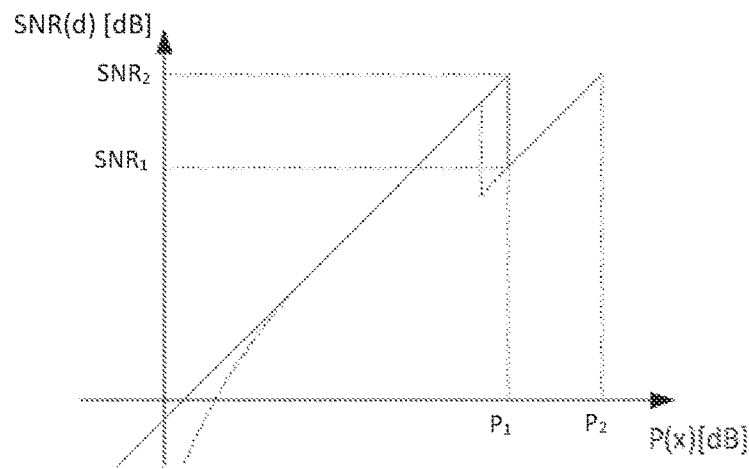
FIG. 6 illustrates a signal-to-noise ratio (SNR) diagram of a DC coupled dual amplifier according to the invention.

FIG. 6 shows in a diagram the signal-to-noise ratio (SNR) of a DC coupled dual amplifier according to an embodiment of the invention, in relation to the normalized dynamic input power P(x). The amplifier has a particularly low-noise first amplifier branch. Generally, the SNR of each amplifier branch increases with increasing input power. The first amplifier branch with the higher gain factor $G_1$ is used up to a first input power $P_1$. At the first input power $P_1$, the first amplifier branch approaches a saturation range, and therefore a switch is made to the second amplifier branch that has a lower gain factor $G_2$. This changes the SNR from the value $SNR_2$ of the first amplifier branch to the (worse) value $SNR_1$ of the second amplifier branch. However, this is acceptable here due to the high input power $P_1$. For low-power input values up to $P_1$ the SNR is therefore improved, e.g. by using a particularly low-noise amplifying element, while the input power range of the circuit is extended up to a maximum admissible input power $P_2$. These two advantages can be reached simultaneously by the present invention, but not by other technologies such as e.g. AGC. Accordingly, an input signal having a very high dynamic range of e.g. 135 dB can be processed.

Figure 7:
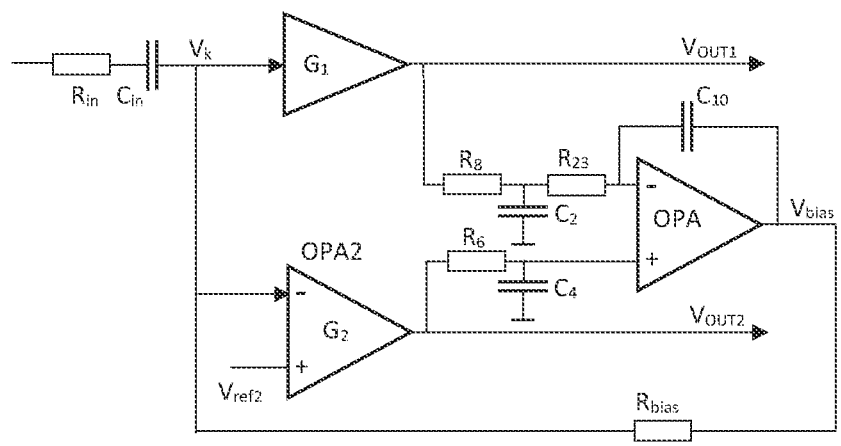
FIG. 7 illustrates a block circuit diagram of a DC coupled dual amplifier circuit according to the invention.

FIG. 7 shows a block circuit diagram of a DC coupled dual amplifier circuit according to an embodiment of the invention. The output voltages $V_{OUT1}, V_{OUT2}$ of the amplifiers are each low-pass filtered by an RC element $R_8C_2$ and $R_6C_4$ in order to obtain their DC voltage components. These are then fed to an operational amplifier OPA that works as a comparator or differentiating element respectively, and, together with another RC element $R_{23}C_{10}$, at the same time works also as an integrator. Its output signal is thus a difference of DC voltage components of the output voltages $V_{OUT1}, V_{OUT2}$ that is integrated over time. It is used directly as a control voltage $V_{bias}$ and is fed back via a feedback resistor $R_{bias}$ to the common input of both amplifier branches in order to control the DC voltage component $V_k$. The feedback resistor $R_{bias}$ may have a very high resistance of >>100 kOhm, for example 1 MOhm, without the regulation becoming unstable.

In this example, the first amplifier branch with the larger gain factor $G_1$ may be implemented by a particularly low-noise transistor as amplifying element, while for the second amplifier branch with the lower gain factor $G_2$ a lower SNR is admissible, so that it may be implemented with a simple operational amplifier OPA2. Here, the control voltage or reference voltage $V_{ref2}$ respectively may be fed directly to the second input of the operational amplifier. In principle, however, each of the two branches may be implemented by one or more discrete transistors and/or operational amplifiers. Usually it is better though to achieve a certain amplification factor with a certain high SNR by discrete transistors than by operational amplifiers. Due to the active regulation, not only JFET transistors may be used, but also bipolar transistors, whose operating point can be adjusted more easily and more stable. This holds also for particularly low-noise amplifiers that require a very high input impedance. Further, each of the two branches may in principle also be controlled by adjusting the reference voltage.

Figure 8:
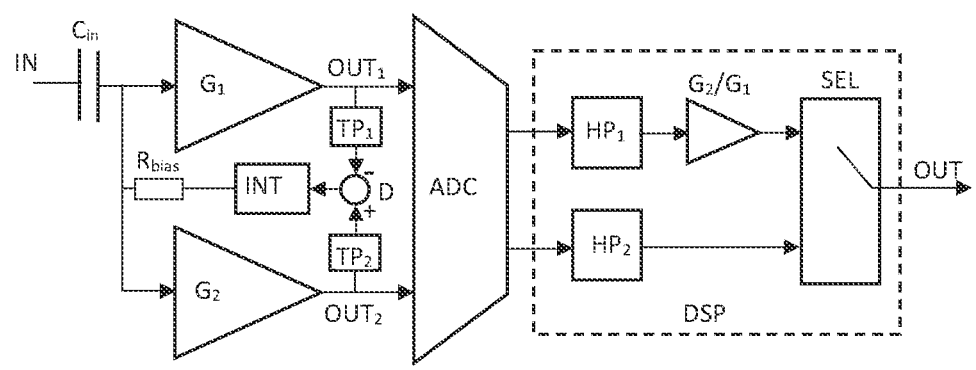
FIG. 8 illustrates a block circuit diagram of a microphone amplifier with a DC coupled dual amplifier circuit according to the invention and subsequent digitization.

FIG. 8 shows a block circuit diagram of a microphone amplifier with a DC coupled dual amplifier circuit according to the invention and subsequent digitization. An analog input audio signal is connected to the input IN and passed through a capacitor $C_{in}$, whereby it is converted into an audio signal with a predetermined DC voltage component. The audio signal with predetermined DC voltage component is passed through at least two parallel DC coupled amplifiers with different gain factors $G_1, G_2$, whose analog output signals $OUT_1, OUT_2$ are separately converted to digital values by means of one or more analog-to-digital converters ADC. As described above, the DC voltage components of the analog output signals $OUT_1, OUT_2$ are aligned to one another through a feedback circuit, i.e. both are controlled to be equal. This feedback circuit comprises two low-passes $TP_1, TP_2$ for obtaining the DC components of the output voltages, a differentiating member D for obtaining the difference between the DC components, and an integrating member INT for integrating the difference between the DC components over time, i.e. in principle its temporal averaging. The resulting voltage is used as a control voltage $V_{bias}$ for regulating the DC voltage component $V_k$ of the input signal, as described above.

After the audio signals have been digitized, they are digitally normalized. For this, they are filtered with digital high-pass filters $HP_1, HP_2$ in order to remove possible DC components, and the gain of the first amplifier branch is digitally compensated by multiplication with $G_2/G_1$. One of the digital signals is selected by means of a switch SEL, depending on the power of the input signal. Since both have the same DC component now, it is assured that the values of the two audio signals arriving at the switch SEL do not differ so much that the switching would lead to interfering noise. The digital high-pass filtering $HP_1, HP_2$, the multiplication by $G_2/G_1$ and the switching SEL may be implemented by one or more microprocessors DSP, possibly with suitable configuration software.

An advantage of the invention is that the dynamic range of ADCs can be utilized better, even when using relatively simple and inexpensive ADCs. An improved resolution of their digital output values is achieved, particularly for input values with low power. In principle, the quantization steps of the analog-to-digital conversion are reduced for input values with low power. Compared with an ADC having a higher resolution, this has the advantage that a simple stereo-ADC may be used, which may have a relatively low resolution but requires significantly less power. At the same time, a particularly low-noise pre-amplification as described above can be used. The invention ensures optimal interaction between the analog amplifier and the digital processing.

Combinations of the above-described embodiments as well as numerous further modifications of the invention are possible. For example, an additional AC coupled buffer may be used that is before the input capacitor $C_{in}$ and thus outside the regulation loop, in order to make the regulation completely independent from the impedance $R_S$ of the audio source. Due to the high SNR, the invention is particularly advantageous for usage in wireless microphones, pocket transmitters for wireless headsets and other battery or accumulator powered mobile audio devices with a microphone or microphone input.

The invention claimed is:

1. An amplifier arrangement comprising
    an input (IN) with a capacitor ($C_{in}$) for connecting to an analog input audio signal, whereby the input audio signal is converted into an audio signal with a predetermined DC voltage component ($V_k$);
    a first amplifier branch which has a first gain factor ($G_1$) and which receives the audio signal with the predetermined DC voltage component ($V_k$) as input signal, the first amplifier branch being DC coupled and outputting a first output voltage ($V_{OUT1}$);
    a second amplifier branch which has a second gain factor ($G_2$) and which also receives the audio signal with the predetermined DC voltage component ($V_k$) as input signal, the second amplifier branch being DC coupled and outputting a second output voltage ($V_{OUT2}$), wherein the second gain factor ($G_2$) is lower than the first gain factor ($G_1$); and
    a differentiating member (D) for generating a voltage difference between the first output voltage ($V_{OUT1}$) and the second output voltage ($V_{OUT2}$), wherein a control voltage ($V_{bias}$) for setting the predetermined DC voltage component ($V_k$) of the input signal is obtained from the voltage difference such that a DC component of the voltage difference is minimized.

2. The amplifier arrangement according to claim 1, further comprising an integrating member (INT) configured for integrating DC components of the voltage difference over time, wherein an output signal of the integrating member is said control voltage ($V_{bias}$).

3. The amplifier arrangement according to claim 2, wherein a closed control loop is created by feeding back the control voltage ($V_{bias}$) to the input signal, and wherein the integrator (INT) is adapted for the closed control loop to have a cutoff frequency of 5 Hz or less.

4. The amplifier arrangement according to claim 2, further comprising at least one low-pass element ($R_{fb}C_{fb}$) connected to an output of the differentiating member (D) to filter said voltage difference provided by the differentiating member (D), wherein a low-pass filtered voltage difference between the first output voltage ($V_{OUT1}$) and the second output voltage ($V_{OUT2}$) is generated that comprises said DC components of the voltage difference that the integrating member (INT) integrates.

5. The amplifier arrangement according to claim 1, further comprising at least two low-pass elements ($R_8C_2$, $R_6C_4$), wherein the at least two low-pass elements are connected to two inputs of the differentiating member (D) to filter the first output voltage ($V_{OUT1}$) and the second output voltage ($V_{OUT2}$) before being input to the differentiating member.

6. The amplifier arrangement according to claim 1, wherein the second gain factor ($G_2$) is at least ten times less than the first gain factor ($G_1$).

7. The amplifier arrangement according to claim 1, wherein the first amplifier branch comprises at least one discrete low-noise transistor as an amplifying element.

8. The amplifier arrangement according to claim 1, wherein the second amplifier branch comprises at least one operational amplifier as an amplifying element.

9. The amplifier arrangement according to claim 1, further comprising a control input for applying a control voltage ($V_{ref}$) that controls a DC component of the first and second output voltages ($V_{OUT1}$, $V_{OUT2}$).

10. The amplifier arrangement according to claim 1, wherein the DC component of the voltage difference is minimized to be substantially zero.

11. The amplifier arrangement according to claim 1, further comprising
    a first analog-to-digital converter that is DC coupled to the output ($OUT_1$) of the first amplifier branch and that converts the first output voltage ($V_{OUT1}$) into a digital value; and
    a second analog-to-digital converter that is DC coupled to the output ($OUT_2$) of the second amplifier branch and that converts the second output voltage ($V_{OUT2}$) into a digital value.

12. The amplifier arrangement according to claim 11, further comprising a software configured processing unit and a switch, the software configured processing unit ($HP_1$, $HP_2$, $G_2/G_1$) being configured for normalizing at least one of the first and second digital values and for compensating the first amplification factor ($G_1$), and the switch being configured for automatically switching between the normalized first digital value and the normalized second digital value, wherein either the normalized first or second digital value is provided at an output (OUT) of the amplifier arrangement.

13. A wireless microphone comprising an amplifier arrangement according to claim 1.

14. A pocket transmitter or mobile radio comprising an amplifier arrangement according to claim 1.

* * * * *